(12) United States Patent
Lee et al.

(10) Patent No.: US 11,063,587 B1
(45) Date of Patent: Jul. 13, 2021

(54) VOLTAGE ON-OFF DETECTOR AND ELECTRONIC DEVICE INCLUDING THE SAME

(71) Applicant: DB HiTek Co., Ltd., Seoul (KR)

(72) Inventors: Sang Mok Lee, Incheon (KR); Joon Tae Jang, Seoul (KR); Seung Hoo Kim, Bucheon-si (KR)

(73) Assignee: DB HiTek Co., Ltd., Seoul (KR)

(*) Notice: Subject to any disclaimer, the term of this patent is extended or adjusted under 35 U.S.C. 154(b) by 0 days.

(21) Appl. No.: 17/007,398

(22) Filed: Aug. 31, 2020

(51) Int. Cl.
| | | |
|---|---|---|
| *G01R 19/155* | (2006.01) |
| *H03K 17/082* | (2006.01) |
| *H03K 17/18* | (2006.01) |
| *H03K 3/037* | (2006.01) |
| *H03K 17/687* | (2006.01) |
| *G01R 19/18* | (2006.01) |

(52) U.S. Cl.
CPC .......... *H03K 17/18* (2013.01); *G01R 19/155* (2013.01); *G01R 19/18* (2013.01); *H03K 3/037* (2013.01); *H03K 17/082* (2013.01); *H03K 17/6872* (2013.01)

(58) Field of Classification Search
CPC ...... G01R 19/155; H03K 3/027; H03K 3/037; H03K 3/0375; H03K 17/08; H03K 17/082; H03K 17/0822; H03K 17/18; H03K 17/687; H03K 17/6872
USPC .................................. 327/108, 109, 419, 427
See application file for complete search history.

(56) References Cited

U.S. PATENT DOCUMENTS

| | | | | | |
|---|---|---|---|---|---|
| 4,791,614 | A | * | 12/1988 | Arakawa ................ | G11C 16/32 365/228 |
| 5,313,420 | A | * | 5/1994 | Masuoka .............. | H01L 27/115 257/E27.103 |
| 5,465,232 | A | * | 11/1995 | Ong .................... | G11C 11/4091 365/189.05 |

* cited by examiner

*Primary Examiner* — William Hernandez
(74) *Attorney, Agent, or Firm* — Andrew D. Fortney; Central California IP Group, P.C.

(57) ABSTRACT

A voltage on-off detector includes an inverter between a first voltage source and a first node and having an input terminal that receives a third voltage, a first transistor having a first gate, and a first source and a first drain between the first node and a second voltage source, a second transistor having a second source connected to the second voltage source, and a second gate and a second drain connected to the first node, and an amplifier having an input terminal connected to an output terminal of the inverter and configured to output a first voltage from the first voltage or a second voltage from the second voltage source based on or in response to an output of the inverter.

20 Claims, 3 Drawing Sheets

VOLTAGE ON-OFF DETECTOR AND ELECTRONIC DEVICE INCLUDING THE SAME

BACKGROUND OF THE INVENTION

Field of the Invention

Embodiments of the present invention relate to a voltage on-off detector and an electronic device including the same.

Discussion of the Related Art

An input/output circuit of an electronic device may function as an electrical interface between one or more internal circuits on the electronic device and an external circuit outside of the electronic device. The input/output circuit of the electronic device may transmit or receive a voltage and/or signal from or to the internal circuit(s) and/or the external circuit.

In an electronic device employing multiple power levels, it is advantageous to consider a low-power design. For example, power consumption of the electronic device may be reduced by turning off power to an unused circuit or block in the electronic device to reduce static leakage in the unused circuit or block.

In an input/output circuit that receives a logic signal from an internal circuit of an electronic device and outputs the logic signal to an external circuit, when the driving power to the internal circuit is turned off, a control signal to a large driver of or in the input/output circuit may enter an unknown state, resulting in a relatively large leakage current and, in turn, an increase in power consumption (e.g., standby power consumption). As a result, reliability of the electronic device may be reduced, the lifetime thereof may decrease, and communication errors may occur between the electronic device and another electronic device (e.g., the external circuit).

SUMMARY OF THE INVENTION

Accordingly, the present invention is directed to a voltage on-off detector and an electronic device including the same that substantially obviate one or more problems due to limitations and disadvantages of the related art.

An object of embodiments of the present invention is to provide a voltage on-off detector that is capable of suppressing or preventing leakage current and reducing power consumption (e.g., standby power consumption), and an electronic device including the same.

Additional advantages, objects, and features of the invention will be set forth in part in the description that follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a voltage on-off detector according to embodiments of the present invention includes an inverter between a first voltage source and a first node and having an input terminal that receives a third (e.g., an input or low power) voltage, a first transistor having a first gate, and a first source and a first drain between the first node and a second voltage source, a second transistor having a second source connected to the second voltage source, and a second gate and a second drain connected to the first node, and an amplifier having an input terminal connected to an output terminal of the inverter and configured to output a first voltage from the first voltage source or a second voltage from the second voltage source based on or in response to an output of the inverter, wherein the first gate of the first transistor receives an output voltage from the amplifier, the second voltage is greater than the first voltage, and the third voltage is less than the second voltage.

The voltage on-off detector may further include a third transistor having a third gate connected to an output terminal of the amplifier, and a third source and a third drain between the second voltage source and a second node, wherein the output terminal of the inverter and the input terminal of the amplifier are connected to the second node.

The inverter may include a first NMOS transistor having a gate, a drain, and a source that receives the first voltage, and a first PMOS transistor having a gate connected to the gate of the first NMOS transistor, and a source and a drain between the drain of the first NMOS transistor and the first node.

The amplifier may include a second NMOS transistor having a gate, a drain, and a source that receives the first voltage, and a second PMOS transistor having a gate connected to the gate of the second NMOS transistor, a drain connected to the drain of the second NMOS transistor, and a source connected to the second voltage, wherein the input terminal of the amplifier may be connected to the gate of the second NMOS transistor and the gate of the second PMOS transistor.

The voltage on-off detector may further include a buffer configured to buffer the output of the amplifier and provide an amplified or buffered voltage or signal to the first gate of the first transistor.

The buffer may include a first CMOS inverter configured to output the first voltage or the second voltage based on or in response to the output of the amplifier, and a second CMOS inverter configured to output the first voltage or the second voltage based on or in response to the output of the first CMOS inverter.

The voltage on-off detector may further include a fourth transistor having a fourth gate connected to the second gate of the second transistor, and a fourth source and a fourth drain between the connection node of the second gate and the second drain and the first node.

Each of the first transistor and the second transistor may be or comprise a PMOS transistor.

Each of the first to third transistors may be or comprise a PMOS transistor, and the fourth transistor may be or comprise an NMOS transistor.

The first voltage may be or comprise a ground voltage, and the third voltage may be greater than the first voltage. The third voltage may be a low power voltage, and the second voltage may be a high power voltage.

A voltage on-off detector according to another embodiment of the present invention includes an inverter between a first voltage source providing a first voltage and a first node and having an input terminal that receives a third voltage, a first transistor having a first gate, and a first source and a first drain between the first node and a second voltage source providing a second voltage, a second transistor having a second source connected to the second voltage source, and a second gate and a second drain connected to the first node, an amplifier having an input terminal connected to an output terminal of the inverter and configured to output the first voltage or the second voltage based on or in response to an output of the inverter, a third transistor having a third gate connected to an output terminal of the amplifier, and a third source and a third drain between the second voltage source and a second node, and a buffer configured to buffer an output of the amplifier, wherein the second node is connected to the output terminal of the inverter and/or the input terminal of the amplifier, the first gate of the first transistor receives an output of the buffer, the first voltage is a ground voltage, the second voltage is greater than the first voltage, and the third voltage is greater than the first voltage but less than the second voltage.

An electronic device according to embodiments of the present invention includes an internal circuit configured to output data and a control signal, an input/output controller configured to perform a logic operation on the data, the control signal and a detection signal and generate a first logic signal and a second logic signal based on or in response to the logic operation, a driver including a PMOS transistor and an NMOS transistor and configured to perform a pull-down or pull-up operation based on or in response to the first and second logic signals, an input/output terminal connected to a connection node of the PMOS transistor and the NMOS transistor, and a voltage on-off detector configured to output the detection signal, wherein the voltage on-off detector is the above-described embodiments.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
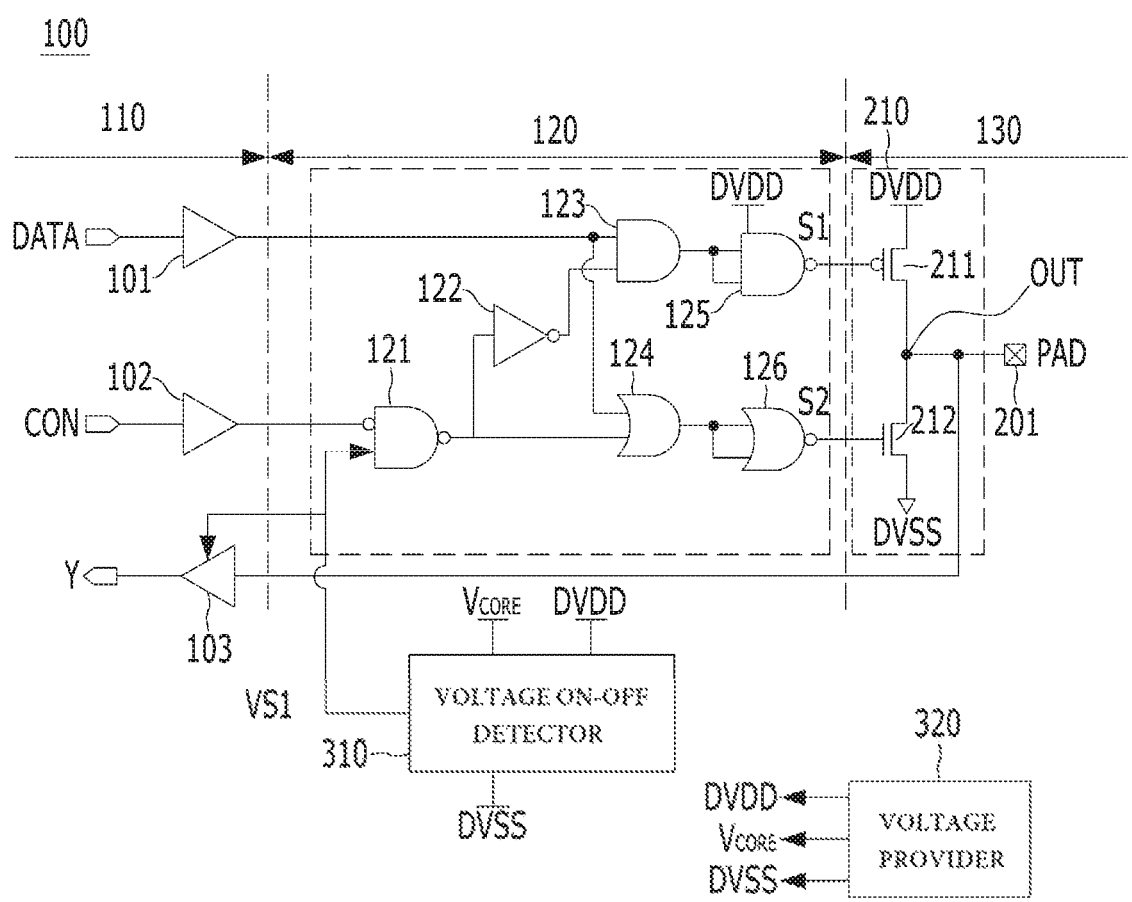
FIG. 1 is a view showing the configuration of an exemplary electronic device according to an embodiment of the present invention.

Reference will now be made in detail to embodiments of the present invention, examples of which are illustrated in the accompanying drawings.

In the following description of various embodiments, it will be understood that, when an element is referred to as being "on" or "under" another element, it can be directly on or under the other element or can be indirectly on or under the other element with one or more intervening elements therebetween. Furthermore, when the expression "on" or "under" is used herein, it may involve not only the upward direction, but also the downward direction, with reference to an element that is on or under another element.

In addition, it will be understood that relative terms used hereinafter such as "first", "second", "on"/"above"/"over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

FIG. 1 shows the configuration of an exemplary electronic device 100 according to an embodiment of the present invention.

Referring to FIG. 1, the electronic device 100 includes an internal circuit 110, an input/output controller 120, an input/output circuit 130, and a voltage on-off detector 310.

The electronic device 100 may further include a voltage provider 320 configured to provide voltages used in the internal circuit 110, the input/output controller 120, the input/output circuit 130, and the voltage on-off detector 310.

The voltage provider 320 may be a voltage generator that provides a plurality of voltages (e.g., 2 or 3) that may be within different voltage ranges.

For example, the voltage provider 320 may include a first voltage source that provides a first voltage DVSS, a second voltage source that provides a second voltage DVDD, and a third voltage source that provides a third voltage $V_{CORE}$. That is, the voltage provider 320 may provide or generate the first voltage DVSS, the second voltage DVDD and the third voltage $V_{CORE}$.

For example, the voltage provider 320 may generate the third voltage $V_{CORE}$, the first voltage DVSS and the second voltage DVDD. The first voltage DVSS may be a "first voltage (for example, 0V)" or a ground voltage. The on-state voltage of the second voltage DVDD may be a "second voltage". For example, the second voltage may be a peak voltage of the second voltage DVDD.

The on-state voltage of the third voltage $V_{CORE}$ may be a third voltage. For example, the third voltage may be a peak voltage of the third voltage $V_{CORE}$.

For example, the second voltage (for example, 3.3V or any other voltage in the range 2.0V to 5V) and the third voltage (for example, 1.2V or any other voltage in the range 0.8V to 1.8V) may be greater than the first voltage (for example, 0V or a ground potential), and the second voltage may be greater than the third voltage.

The internal circuit 110 provides data DATA and a control signal CON to the input/output controller 120.

For example, the internal circuit 110 may include a first amplifier or buffer 101 configured to amplify or buffer the data DATA and output (e.g., as a result of amplification or buffering) amplified or buffered data to the input/output controller 120, and a second amplifier or buffer 102 configured to amplify or buffer the control signal CON and output (e.g., as a result of amplification or buffering) an amplified or buffered control signal to the input/output controller 120.

For example, each of the first and second amplifiers or buffers 101 and 102 may be or comprise a buffer, an operational amplifier, a differential amplifier or an inverter, but is not limited thereto.

The internal circuit 110 may further include a third amplifier or buffer 103 configured to receive a signal Y from the input/output circuit 130 and amplify or buffer and output the same (e.g., to another circuit in the internal circuit 110).

For example, the third amplifier or buffer 103 may be or comprise a buffer, an operational amplifier, a differential amplifier or an inverter, but is not limited thereto.

The input/output controller 120 generates first and second logic signals S1 and S2 configured to control a driver 210 of or in the input/output circuit 130 based on and/or in response to the data DATA and the control signal CON from the internal circuit 110 and a detection signal VS1 from the voltage on-off detector 310.

For example, the input/output controller 120 may perform a logic operation on the received data DATA, the control signal CON and the detection signal VS1, and provide the first and second logic signals S1 and S2 (e.g., based on or in response to a result of the logic operation) to the input/output circuit 130.

The input/output controller 120 may include a first logic gate 121, a first inverter 122, a second logic gate 123, a third logic gate 124, a fourth logic gate 125, and a fifth logic gate 126.

The first logic gate 121 performs a logic operation on the control signal CON and the detection signal VS1 from the voltage on-off detector 310 and outputs a first signal (e.g., based on the logic operation).

For example, the first logic gate 121 may be a NAND gate, but is not limited thereto. For example, the inverted control signal CON may be provided to the first logic gate 121, but is not limited thereto. For example, an inverter may be between an output terminal of the second amplifier or buffer 102 and one input terminal of the first logic gate 121.

The first inverter 122 inverts the first signal from the first logic gate 121 and outputs an inverted first signal.

The second logic gate 123 performs a logic operation on the data DATA and the output of the first inverter 122, and outputs a second signal (e.g., based on the logic operation).

For example, the second logic gate 123 may be an AND gate, but is not limited thereto.

The third logic gate 124 performs a logic operation on the data DATA and the first signal of the first logic gate 121 and outputs a third signal (e.g., based on the logic operation).

For example, the third logic gate 124 may be an OR gate, but is not limited thereto.

The fourth logic gate 125 has first and second input terminals, and performs a logic operation on the second signal input to each of the first and second input terminals and generates a first logic signal S1 (e.g., based on the logic operation).

For example, the fourth logic gate 125 may be a NAND gate, but is not limited thereto.

The fifth logic gate 126 has third and fourth input terminals, and performs a logic operation on the third signal input to each of the third and fourth input terminals and generates a second logic signal S2 (e.g., based on the logic operation).

For example, the fifth logic gate 126 may be a NOR gate, but is not limited thereto.

The input/output circuit 130 may include an input/output terminal 201 and the driver 210. The input/output terminal 201 may comprise a pad (e.g., PAD).

The driver 210 has an output node OUT, and outputs the first voltage (for example, 0V) DVSS or the second voltage (for example, 3.3V) DVDD at the output node OUT based on or in response to the first and second logic signals S1 and S2. The output node OUT is connected to the input/output terminal 201.

For example, the second voltage of the second voltage DVDD may be greater than the first voltage DVSS.

In addition, for example, the third voltage $V_{CORE}$ may be in a voltage range greater than the first voltage DVSS and less than the second voltage DVDD.

The driver 210 may perform a pull-up or pull-down operation in response to the first and second logic signals S1 and S2 and output the second voltage, which is a pull-up voltage, or the first voltage, which is a pull-down voltage, on the output node OUT.

The driver 210 may include a PMOS transistor 211 and an NMOS transistor 212.

The PMOS transistor 211 may have a gate that receives the first logic signal S1, a source that receives the second voltage DVDD, and a drain connected to the input/output terminal 201.

The NMOS transistor 212 may have a gate that receives the second logic signal S2, a source that receives the first voltage DVSS, and a drain connected to a connection node of the input/output terminal 201 and the PMOS transistor 211.

The drain of the PMOS transistor 211 and the drain of the NMOS transistor 212 may be connected to the output node OUT.

The voltage on-off detector 310 detects whether the third voltage $V_{CORE}$ from the voltage provider 320 is on or off, and outputs the detection signal VS1 based on or in response to a result of the detection.

When the third voltage $V_{CORE}$ is "on", the third voltage $V_{CORE}$ is provided from the voltage provider 320 (for example, 1.2V), and when the third voltage $V_{CORE}$ is "off", the third voltage $V_{CORE}$ is a ground voltage (for example, 0V).

For example, upon detecting that the third voltage $V_{CORE}$ from the voltage provider 320 is on and the second voltage DVDD is on, the voltage on-off detector 310 may output the detection signal VS1 having a first level (for example, a high binary logic level), and the electronic device 100 may perform input/output operations using the input/output terminal 201 based on or in response to the detection signal VS1 (which may be an input to one or more logic operations in the input/output controller 120).

Alternatively, upon detecting that the third voltage $V_{CORE}$ is off, the voltage on-off detector 310 may output the detection signal VS1 having a second level (for example, a low binary logic level), the driver 210 may be turned off by the input/output controller 120 (e.g., as a result of the logic operation[s]) based on or in response to the detection signal VS1 having the second level, and the input/output terminal 201 may enter a high impedance state. In addition, when the third voltage $V_{CORE}$ is off, the input path from the input/output terminal 201 may have a known state (e.g., enabled or inactive, which may correspond to a high binary logic state or a low binary logic state), thereby making it possible to suppress or prevent leakage current.

Figure 2:
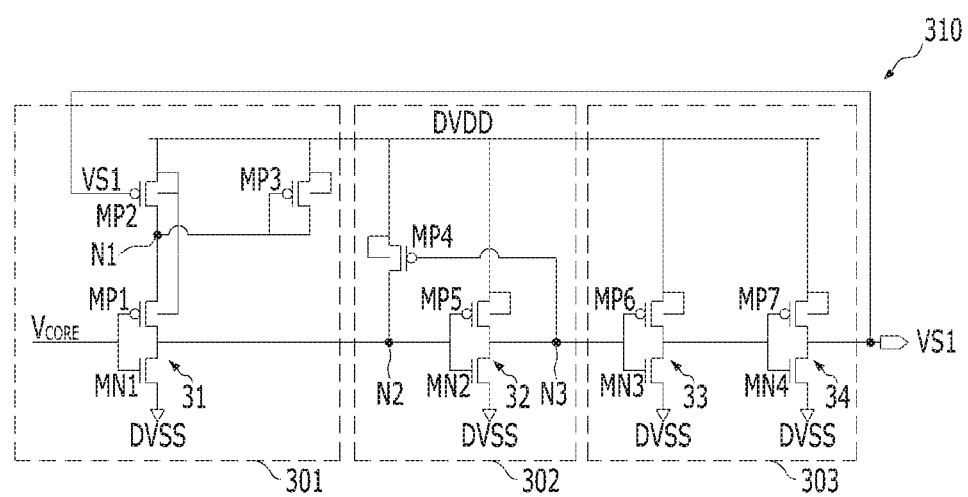
FIG. 2 is a circuit diagram of an embodiment of the voltage on-off detector in FIG. 1.

FIG. 2 is a circuit diagram of an embodiment of the voltage on-off detector 310 in FIG. 1.

The voltage on-off detector 310 may also be referred to as a "voltage detector" or a "power on-off detector".

Referring to FIG. 2, the voltage on-off detector 310 may detect whether the third voltage $V_{CORE}$ is on or off and output the detection signal VS1 based on or in response to a result of the detection.

The voltage on-off detector 310 may include a detection circuit 301, an amplification circuit 302, and a buffer 303.

The detection circuit 301 may include an inverter 31 having a first PMOS transistor MP1 and a first NMOS transistor MN1, a first (or third) transistor MP2, and a second (or fourth) transistor MP3.

The inverter 31 may be a CMOS inverter, but is not limited thereto.

The inverter 31 may be between the first voltage source, which provides the first voltage DVSS, and a first node N1, and may have an input terminal that receives the third voltage $V_{CORE}$.

The inverter 31 may output a signal having a voltage pulled down to the first voltage or pulled up to a voltage at the first node N1 based on or in response to the third voltage $V_{CORE}$.

In the inverter 31, the first NMOS transistor MN1 may have a gate, a drain, and a source. The source of the first NMOS transistor MN1 receives the first voltage DVSS. The first PMOS transistor MP1 may have a gate connected to the gate of the first NMOS transistor MN1, and a source and a drain between the drain of the first NMOS transistor MN1 and the first node N1.

The third voltage $V_{CORE}$ may be input to the gate of the first NMOS transistor MN1 and the gate of the first PMOS transistor MP1.

The first (or third) transistor MP2 may have a first gate, and a first source and a first drain between the first node N1 and the second voltage source. For example, the second voltage DVDD may be provided to the first source.

For example, the first (or third) transistor MP2 may be a PMOS transistor.

In addition, the first (or third) transistor MP2 may have a first bulk (or first body) or a first bulk node (or first body node) coupled or connected to the first source and that also receives the second voltage DVDD.

In addition, the first PMOS transistor MP1 of the inverter 31 may have a second bulk (or second body) or a second bulk node (or second body node) connected to the first bulk of the first (or third) transistor MP2.

The second (or fourth) transistor MP3 may have a second source connected to the second voltage source, and a second gate and a second drain connected to each other, and a connection node of the second gate and the second drain may be connected to the first node N1. For example, the second voltage DVDD may be provided to the second source. The second (or fourth) transistor MP3 may have a third bulk (or third body) or a third bulk node (or third body node) coupled or connected to the second source that receives the second voltage DVDD.

The amplification circuit 302 may amplify the output of the inverter 31.

For example, the amplification circuit 302 may output a voltage pulled down to the first voltage of the first voltage DVSS or pulled up to the second voltage of the second voltage DVDD based on or in response to the output of the inverter 31.

The amplification circuit 302 may include an amplifier or inverter 32 and a third (or fifth) transistor MP4. Alternatively, at least one of the detection circuit 301 and the amplification circuit 302 may comprise a level shifter, configured to change a voltage of the input (e.g., $V_{CORE}$) to a different voltage (e.g., DVDD).

The amplifier or inverter 32 may have an input terminal connected to an output terminal of the inverter 31, and output a voltage pulled up or pulled down between the first voltage DVSS and the second voltage DVDD based on or in response to the output of the inverter 31 from the inverter 31. For example, the output of the inverter 31 may be provided to the input terminal of the amplifier or inverter 32.

For example, the amplifier or inverter 32 may include a second NMOS transistor MN2 and a second PMOS transistor MP5.

For example, the second NMOS transistor MN2 may have a gate, a drain, and a source. The source of the second NMOS transistor MN2 receives the first voltage DVSS. For example, the second PMOS transistor MP5 may have a gate connected to the gate of the second NMOS transistor MN2, a drain connected to the drain of the second NMOS transistor MN2, and a source connected to the second voltage DVDD. The second PMOS transistor MP5 may have a bulk (or body) or a bulk node (or body node) coupled or connected to the source thereof.

For example, the input terminal of the amplifier or buffer 32 may be connected to the gate of the second NMOS transistor MN2 and the gate of the second PMOS transistor MP5, and an output terminal of the amplifier or inverter 32 may be connected to the drain of the second NMOS transistor MN2 and the drain of the second PMOS transistor MP5.

The third (or fifth) transistor MP4 may have a third gate connected to the output terminal of the amplifier or inverter 32, and a third source and a third drain between the second voltage source and a second node N2. The second node N2 may be connected to the output terminal of the inverter 31 and the input terminal of the amplifier or inverter 32.

The buffer 303 may buffer the output of the amplifier or inverter 32 and output an amplified or buffered voltage or signal. The output of the buffer 303 may be provided to the first gate of the first (or third) transistor MP2. In another embodiment, the buffer 303 may be omitted, and, in this case, the output of the amplifier or inverter 32 may be provided to the first gate of the first (or third) transistor MP2.

The buffer 303 may include a first CMOS inverter 33 configured to output one of the first voltage DVSS and the second voltage DVDD based on or in response to the output of the amplifier or inverter 32, and a second CMOS inverter 34 configured to output one of the first voltage DVSS and the second voltage DVDD based on or in response to the output of the first CMOS inverter 33.

The first CMOS inverter 33 may include an NMOS transistor MN3 and a PMOS transistor MP6, and the second CMOS inverter 34 may include an NMOS transistor MN4 and a PMOS transistor MP7. The PMOS transistors MP6 and MP7 of the first and second CMOS inverters 33 and 34 may have a bulk (or body) or a bulk node (or body node) coupled or connected to a source thereof. The source of each of the PMOS transistors MP6 or and MP7 receives the second voltage DVDD.

The buffer 303 may output the detection signal VS1, which may be provided to the gate of the first (or third) transistor MP2. In an embodiment in which the buffer 303 is omitted, the detection signal VS1 may be the output of the amplifier or inverter 32.

For example, each of the first (or third) transistor MP2, the second (or fourth) transistor MP3 and the third (or fifth) transistor MP4 may be a PMOS transistor, but is not limited thereto.

By virtue of operations of the first to third (or third to fifth) transistors MP2, MP3 and MP4, it may be possible to prevent leakage current in the voltage on-off detector 310 and reduce power consumption of the voltage on-off detector 310.

The operation of the voltage on-off detector 310 will hereinafter be described.

Figure 4A:
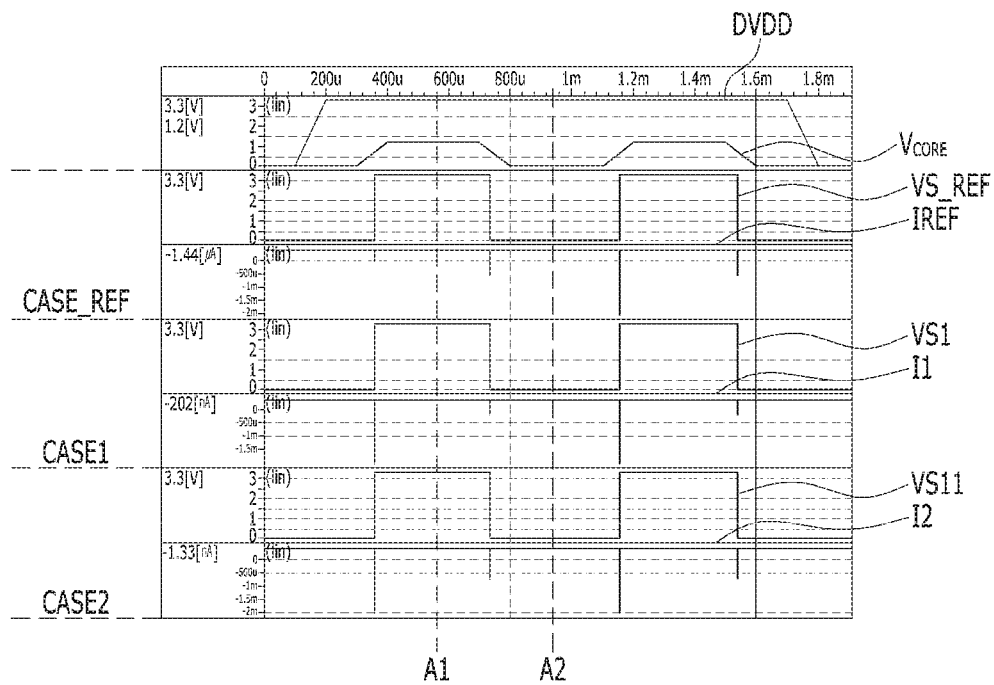
FIG. 4A is a waveform diagram illustrating simulation results of a detection signal and current flowing in different voltage on-off detectors in each of a reference case, a first case and a second case.

When the second voltage DVDD is on and the third voltage $V_{CORE}$ is on, the voltage of the detection signal VS1 may be the second voltage (i.e., substantially equal to DVDD), which may be referred to as a "first state", a "voltage on state", a "power up state" or a "power on state" of the voltage on-off detector 310 (see, e.g., A1 in FIG. 4A).

When the second voltage DVDD is on, and the third voltage $V_{CORE}$ is off, the third voltage $V_{CORE}$ is floating or at a ground potential (for example, 0V). As a result, the third voltage $V_{CORE}$ may enter a second state (see, e.g., A2 in FIG. 4A). The "second state" of the third voltage $V_{COPE}$ may be referred to as a "power down state", a "voltage down state" or a "power off state" of the third voltage $V_{core}$ and/or the voltage on-off detector 310.

Immediately after a transition to the second state A2, the first NMOS transistor MN1 of the inverter 31 is off, the first PMOS transistor MP1 thereof is on, and the first (or third) transistor MP2 remains off.

In addition, in the second state A2, the voltage at the first node N1 may have a value obtained by subtracting a source-drain voltage of the second (or fourth) transistor MP3 (or a threshold voltage of the second [or fourth] transistor MP3) from the second voltage (in FIG. 2, DVDD).

In the second state A2, the voltage at the first node N1 may be transferred to the second node N2 by turning-on the first PMOS transistor MP1, the voltage at the second node N2 may be inverted and/or amplified by the amplifier or inverter 32, the voltage at the third node N3 may be pulled down to the first voltage (in FIG. 2, DVSS), the third (or fifth) transistor MP4 may be turned on by the voltage at the third node N3, and the voltage at the second node N2 may be rapidly pulled up to the second voltage (DVDD), thereby reducing power consumption of the amplifier or inverter 32.

In addition, in the second state A2, the voltage at the third node N3, pulled down to the first voltage (DVSS), may be buffered by the buffer 303, and the detection signal VS1 having the first voltage DVSS may be output by the buffer 303. The first (or third) transistor MP2 may then be turned on by the detection signal VS1, and the voltage at the third node N3 may be pulled up to the second voltage (DVDD), thereby preventing or blocking leakage current from flowing from the second node N2 through the first NMOS transistor MN1 of the inverter 31.

The detection signal VS1 may be used in a logic circuit or IP requiring a determination as to whether the third voltage $V_{CORE}$ is on or off.

When the voltage on-off detector 310 transitions from the second state to the first state, the first NMOS transistor MN1 of the inverter 31 is on, the voltage at the second node N2 is pulled down to the first voltage, the voltage at the third node N3 is pulled up to the second voltage (DVDD) by the amplifier or inverter 32, and the third (or fifth) transistor MP4 is turned off. In addition, in the first state, the voltage at the third node N3, pulled up to the second voltage (DVDD), may be buffered by the buffer 303, the detection signal VS1 having the second voltage may be output by the buffer 303, the first (or third) transistor MP2 may be turned off by the detection signal VS1, and the voltage at the first node N1 may have the value obtained by subtracting the source-drain voltage of the second (or fourth) transistor MP3 (or the threshold voltage of the second [or fourth] transistor MP3) from the second voltage.

In the embodiment of FIG. 2, because the voltage at the first node N1 becomes less than the second voltage due to the presence of the second (or fourth) transistor MP3, the first PMOS transistor MP1 of the inverter 31 may have a relatively large on resistance, thereby reducing power consumption resulting from the second voltage.

In addition, in the embodiment of FIG. 2, it may be possible not only to process the third voltage $V_{CORE}$ (which is less than the second voltage DVDD), but also to reduce power consumption when the third voltage $V_{CORE}$ and the second voltage DVDD are both on.

Figure 3:
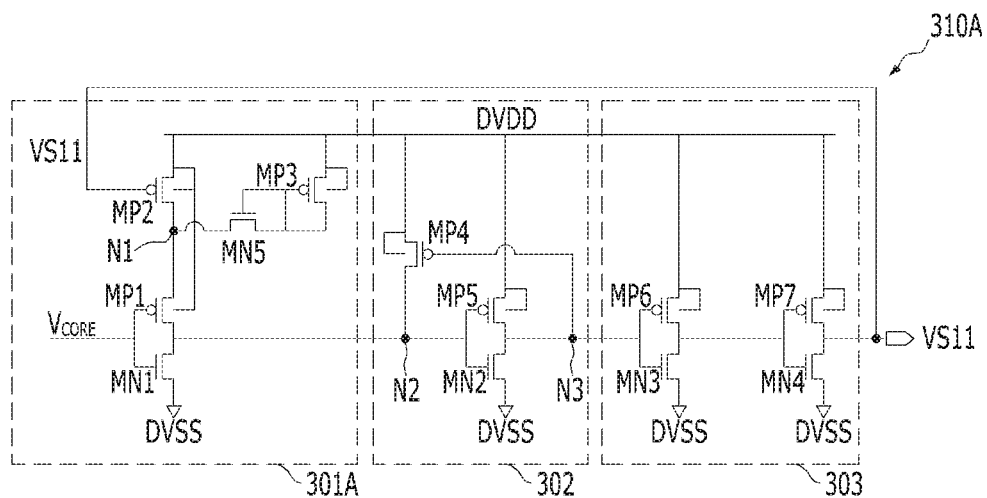
FIG. 3 is a circuit diagram of another voltage on-off detector according to another embodiment.

FIG. 3 is a circuit diagram of an exemplary voltage on-off detector 310A according to another embodiment. In FIG. 3, the same components as those in FIG. 2 are denoted by the same reference numerals, and a description thereof will thus be omitted or given briefly.

In comparison with FIG. 2, a detection circuit 301A of the voltage on-off detector 310A of FIG. 3 may further include a fourth (or sixth) transistor MN5, and the buffer 303 may output a first detection signal VS11.

The fourth (or sixth) transistor MN5 may have a fourth gate connected to the gate of the second (or fourth) transistor MP3, and a fourth source and a fourth drain between (i) a node connecting the gate and drain of the second (or fourth) transistor MP3 and (ii) the first node N1.

For example, the fourth (or sixth) transistor MN5 may be an NMOS transistor, but is not limited thereto.

In the first state, the voltage at the first node N1 may have a value obtained by subtracting the source-drain voltage of the second (or fourth) transistor MP3 (or the threshold voltage [Vtp] of the second [or fourth] transistor MP3) and a source-drain voltage of the fourth (or sixth) transistor MN5 (or a threshold voltage [Vtn] of the fourth [or sixth] transistor MN5) from the second voltage (i.e., the second voltage−Vtp−Vtn).

Namely, in comparison with FIG. 2, in the embodiment of FIG. 3, the voltage at the first node N1 may be decreased, and the on resistance of the first PMOS transistor MP1 may be increased, thereby reducing leakage current and power consumption even more significantly.

Figure 4B:
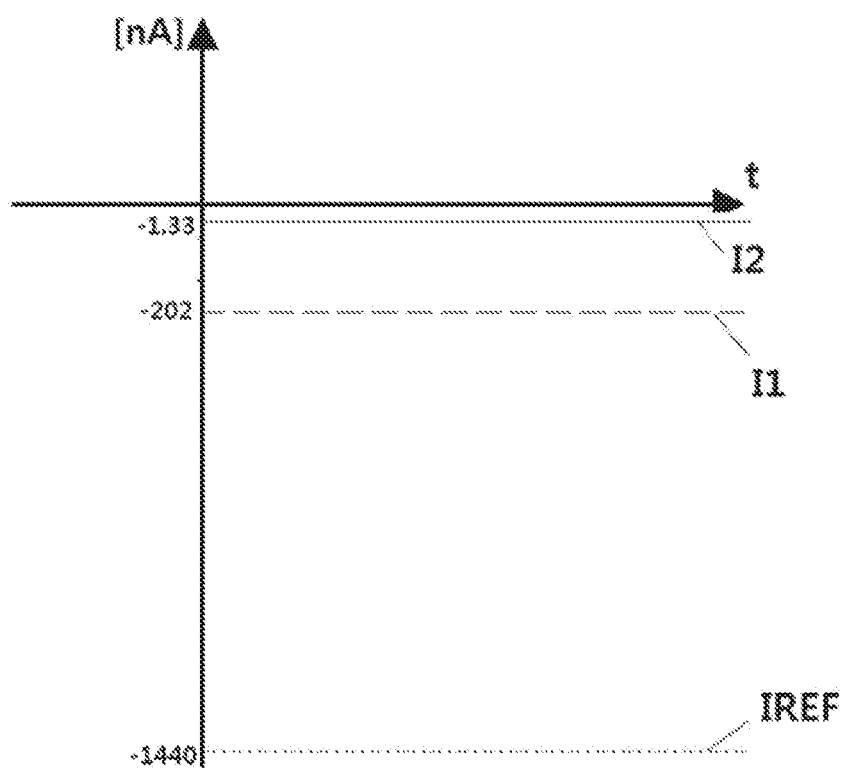
FIG. 4B is a diagram showing values of certain currents.

FIG. 4A is a waveform diagram illustrating the detection signal and the current flow in simulations of exemplary voltage on-off detectors in each of a reference case CASE_REF, a first case CASE1 and a second case CASE2. FIG. 4B is a diagram showing values of certain currents in FIG. 4A.

The reference case CASE_REF represents a simulation of a voltage on-off detector in which, in FIG. 2, the detection signal VS1 is not fed back to the gate of the first (or third) transistor MP2, the gate of the first (or third) transistor MP2 is connected in common to the gates of the first NMOS transistor MN1 and the first PMOS transistor MP1 of the inverter 31, and the second and third (or fourth and fifth) transistors MP3 and MP4 are omitted. The waveforms in FIG. 4A show a detection signal VS_REF output by the comparative voltage on-off detector, and a current IREF in the comparative voltage on-off detector (FIG. 4B).

The first case CASE1 represents a simulation of the voltage on-off detector 310 of FIG. 2. The waveforms in FIG. 4A show the detection signal VS1 output by the voltage on-off detector 310, and a current I1 in the voltage on-off detector 310. The second case CASE2 represents a simulation of the voltage on-off detector 310A of FIG. 3. The waveforms in FIG. 4A show the detection signal VS11 output by the voltage on-off detector 310A, and FIG. 4B shows a current I2 in the voltage on-off detector 310A.

Here, the current (for example, IREF, I1 or I2; see FIG. 4B) in the voltage on-off detector may be the sum of the current flowing in the inverter 31, the current flowing in the amplifier or inverter 32, and the current flowing in the buffer 303.

Referring to FIG. 4A, in the reference case CASE_REF, because the third voltage $V_{CORE}$ is less than the second voltage (e.g., DVDD), a current path may be formed between the first (or third) transistor MP2 and the inverter 31, resulting in static leakage of current and, in turn, an increase in power consumption.

The current IREF in the voltage on-off detector in the reference simulation CASE_REF is −1.44 μA. By contrast, the current I1 in the voltage on-off detector 310 (FIG. 2) in the CASE1 simulation is about −202 nA, and the current I2 in the voltage on-off detector 310A (FIG. 3) in the CASE2 simulation is about −1.33 nA.

As compared with the reference case CASE_REF, in the CASE1 and CASE2 simulations, static leakage current is significantly suppressed, the currents in the inverter 31 and amplifier 32 are reduced, and power consumption in the voltage on-off detectors 310 and 310A is reduced.

In the reference case CASE_REF, when the voltage on-off detector detects the state (e.g., on/off state) of the third voltage $V_{CORE}$, the first PMOS transistor MP1 of the inverter 31 may not be completely off, which may result in continuous leakage current.

A voltage on-off detector according to embodiments of the present invention may suppress or prevent leakage current and reduce power consumption, while maintaining the basic function of detecting the state of the low power voltage $V_{CORE}$. In conclusion, the voltage on-off detectors according to embodiments of the present invention and electronic devices including the same may suppress or prevent leakage current and reduce power consumption.

As is apparent from the above description, according to various embodiments, it may be possible to suppress or prevent leakage current and reduce power consumption.

The embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments. Therefore, combinations of features of different embodiments are meant to be within the scope of the invention.

What is claimed is:

1. A voltage on-off detector comprising:
   an inverter between a first voltage source and a first node and having an input terminal that receives a third voltage;
   a first transistor having a first gate, and a first source and a first drain between the first node and a second voltage source;
   a second transistor having a second source connected to the second voltage source, and a second gate and a second drain connected to the first node; and
   an amplifier having an input terminal connected to an output terminal of the inverter and configured to output a first voltage from the first voltage source or a second voltage from the second voltage source based on or in response to an output of the inverter,
   wherein the first gate of the first transistor receives an output voltage from the amplifier, the second voltage is greater than the first voltage, and the third voltage is less than the second voltage.

2. The voltage on-off detector according to claim 1, further comprising a third transistor having a third gate connected to an output terminal of the amplifier, and a third source and a third drain between the second voltage source and a second node,
   wherein the output terminal of the inverter and the input terminal of the amplifier are connected to the second node.

3. The voltage on-off detector according to claim 2, wherein the amplifier comprises:

a second NMOS transistor having a gate, a drain, and a source that receives the first voltage; and
   a second PMOS transistor having a gate connected to the gate of the second NMOS transistor, a drain connected to the drain of the second NMOS transistor, and a source connected to the second voltage,
   wherein the input terminal of the amplifier is connected to the gate of the second NMOS transistor and the gate of the second PMOS transistor.

4. The voltage on-off detector according to claim 2, further comprising a fourth transistor having a fourth gate connected to the second gate of the second transistor, and a fourth source and a fourth drain between the connection node of the second gate and the second drain and the first node.

5. The voltage on-off detector according to claim 4, wherein each of the first to third transistors comprises a PMOS transistor, and the fourth transistor comprises an NMOS transistor.

6. The voltage on-off detector according to claim 1, wherein the inverter comprises:
   a first NMOS transistor having a gate, a drain, and a source that receives the first voltage; and
   a first PMOS transistor having a gate connected to the gate of the first NMOS transistor, and a source and a drain between the drain of the first NMOS transistor and the first node.

7. The voltage on-off detector according to claim 1, further comprising a buffer configured to buffer the output of the amplifier and provide an amplified or buffered signal to the first gate of the first transistor.

8. The voltage on-off detector according to claim 7, wherein the buffer comprises:
   a first CMOS inverter configured to output the first voltage or the second voltage based on or in response to the output of the amplifier; and
   a second CMOS inverter configured to output the first voltage or the second voltage based on or in response to the output of the first CMOS inverter.

9. The voltage on-off detector according to claim 1, wherein each of the first transistor and the second transistor comprises a PMOS transistor.

10. The voltage on-off detector according to claim 1, wherein the first voltage comprises a ground voltage, and wherein the third voltage is greater than the first voltage.

11. A voltage on-off detector comprising:
    an inverter between a first voltage source providing a first voltage and a first node and having an input terminal that receives a third voltage;
    a first transistor having a first gate, and a first source and a first drain between the first node and a second voltage source providing a second voltage;
    a second transistor having a second source connected to the second voltage source, and a second gate and a second drain connected to the first node;
    an amplifier having an input terminal connected to an output terminal of the inverter and configured to output the first voltage or the second voltage based on or in response to an output of the inverter;
    a third transistor having a third gate connected to an output terminal of the amplifier, and a third source and a third drain between the second voltage source and a second node; and
    a buffer configured to buffer an output of the amplifier, wherein
    the second node is connected to the output terminal of the inverter and/or the input terminal of the amplifier, the first gate of the first transistor receives an output of the buffer, the first voltage is a ground voltage, the second voltage is greater than the first voltage, and the third voltage is greater than the first voltage but less than the second voltage.

12. An electronic device comprising:

an internal circuit configured to output data and a control signal;

an input/output controller configured to perform a logic operation on the data, the control signal and a detection signal and generate a first logic signal and a second logic signal based on or in response to the logic operation;

a driver comprising a PMOS transistor and an NMOS transistor and configured to perform a pull-down or pull-up operation based on or in response to the first and second logic signals;

an input/output terminal connected to a connection node of the PMOS transistor and the NMOS transistor; and a voltage on-off detector configured to output the detection signal, wherein the voltage on-off detector comprises:

an inverter between a first voltage source and a first node and having an input terminal that receives a third voltage;

a first transistor having a first gate, and a first source and a first drain between the first node and a second voltage source;

a second transistor having a second source connected to the second voltage source, and a second gate and a second drain connected to the first node; and an amplifier having an input terminal connected to an output terminal of the inverter and configured to output a first voltage from the first voltage source and a second voltage from the second voltage source based on or in response to an output of the inverter, wherein the first gate of the first transistor receives an output voltage from the amplifier, the second voltage is greater than the first voltage, and the third voltage is less than the second voltage.

13. The electronic device according to claim 12, wherein the voltage on-off detector further comprises a third transistor having a third gate connected to an output terminal of the amplifier, and a third source and a third drain between the second voltage source and a second node, wherein the output terminal of the inverter and the input terminal of the amplifier are connected to the second node.

14. The electronic device according to claim 13, wherein the amplifier comprises:

a second NMOS transistor having a gate, a drain, and a source that receives the first voltage; and a second PMOS transistor having a gate connected to the gate of the second NMOS transistor, a drain connected to the drain of the second NMOS transistor, and a source connected to the second voltage, wherein the input terminal of the amplifier is connected to the gate of the second NMOS transistor and the gate of the second PMOS transistor.

15. The electronic device according to claim 13, wherein the voltage on-off detector further comprises a fourth transistor having a fourth gate connected to the second gate of the second transistor, and a fourth source and a fourth drain between the connection node of the second gate and the second drain and the first node.

16. The electronic device according to claim 15, wherein each of the first to third transistors comprises a PMOS transistor, and the fourth transistor comprises an NMOS transistor.

17. The electronic device according to claim 12, wherein the inverter comprises:

a first NMOS transistor having a gate, a drain, and a source that receives the first voltage; and a first PMOS transistor having a gate connected to the gate of the first NMOS transistor, and a source and a drain between the drain of the first NMOS transistor and the first node.

18. The electronic device according to claim 12, wherein the voltage on-off detector further comprises a buffer configured to buffer the output of the amplifier and provide an amplified or buffered voltage or signal to the first gate of the first transistor.

19. The electronic device according to claim 18, wherein the buffer comprises:

a first CMOS inverter configured to output the first voltage or the second voltage based on or in response to the output of the amplifier; and a second CMOS inverter configured to output the first voltage or the second voltage based on or in response to the output of the first CMOS inverter.

20. The electronic device according to claim 12, wherein the first voltage comprises a ground voltage, and wherein the third voltage is greater than the first voltage.

* * * * *